United States Patent [19]
Armiento et al.

[11] Patent Number: 4,603,469
[45] Date of Patent: Aug. 5, 1986

[54] FABRICATION OF COMPLEMENTARY MODULATION-DOPED FILED EFFECT TRANSISTORS

[75] Inventors: Craig A. Armiento, Burlington; Peter E. Norris, Cambridge, both of Mass.

[73] Assignee: GTE Laboratories Incorporated, Waltham, Mass.

[21] Appl. No.: 715,698

[22] Filed: Mar. 25, 1985

[51] Int. Cl.$^4$ .................. H01L 21/20; H01L 21/265
[52] U.S. Cl. .......................................... 29/571; 29/571; 29/576 B; 29/576 E; 148/187
[58] Field of Search ................ 29/571, 576 E, 576 B; 148/187

[56] References Cited
U.S. PATENT DOCUMENTS 4,452,646  6/1984  Zuleeg ........................... 29/571 X
4,545,109  10/1985  Reichert ............................ 29/571

FOREIGN PATENT DOCUMENTS 64370  11/1982  European Pat. Off. ..

OTHER PUBLICATIONS

Lee et al., "High-Performance Modulation-Doped GaAs Integrated Circuits with Planar Structures", *Electronics Letters*, vol. 19, No. 5, Mar. 3, 1983, London, G.B., pp. 155–157.
Abe et al., "Advanced Device Technology for High Speed GaAs VLSI", *Solid State Devices* 1982, ESS-DERC-SSSDT Meeting, Sep. 13–16, 1982, Munich, Germ., pp. 25–50.

Primary Examiner—George T. Ozaki
Attorney, Agent, or Firm—David M. Keay

[57] ABSTRACT

Method of fabricating a monolithic integrated circuit structure incorporating a complementary pair of GaAs-/AlGaAs modulation-doped field effect transistors (MODFET's) including providing a substrate of semi-insulating GaAs, depositing an epitaxial layer of undoped AlGaAs on its surface, and ion-implanting a heavily doped N-type donor region and a heavily doped P-type acceptor region in the undoped AlGaAs. A thin spacer layer of undoped AlGaAs is epitaxially deposited on the previously deposited AlGaAs layer, and an epitaxial layer of undoped GaAs is deposited on the spacer layer. First and second gate members which form Schottky barriers with the GaAs are placed on the GaAs layer overlying portions of the N-type donor region and P-type acceptor region, respectively. N-type source and drain zones are formed in the GaAs layer on opposite sides of the first gate member, and P-type source and drain zones are formed in the GaAs layer on opposite sides of the second gate member. A first MODFET is provided by the N-type donor region, the N-type source and drain, the region of undoped GaAs between the source and drain which form a two-dimensional electron gas region, and the first gate member. A second MODFET complementary to the first is provided by the P-type acceptor region, the P-type source and drain, the region of undoped GaAs between the source and drain which form a two-dimensional hole gas region, and the second gate member.

6 Claims, 6 Drawing Figures

FABRICATION OF COMPLEMENTARY MODULATION-DOPED FILED EFFECT TRANSISTORS

BACKGROUND OF THE INVENTION

This invention relates to monolithic integrated circuit structures. More particularly, it is concerned with the fabrication of complementary modulation-doped field effect transistors.

Interest in high-speed digital circuitry and high frequency microwave devices has prompted investigation of the gallium arsenide/aluminum gallium arsenide (GaAs/AlGaAs) material system because of its inherent speed advantages over silicon. One type of device which has been developed is the modulation-doped field effect transistor (MODFET). The structure of this device includes an arrangement of layers of GaAs and AlGaAs. A thin potential well is formed in a layer of undoped GaAs which is adjacent to and may be spaced from a layer of heavily doped N-type AlGaAs. Electrons from the heavily doped AlGaAs fall into this potential well forming a two-dimensional electron gas (2DEG) in which electrons have high mobility due to the absence of ionized impurity scattering in the undoped GaAs. A Schottky barrier gate on the surface of the N-type AlGaAs is employed to control the conduction of the two-dimensional electron gas between source and drain regions formed in the undoped GaAs. This device operates in a manner similar to a silicon N-type MOS transistor, except that the high mobility of the two-dimensional electron gas in the undoped GaAs results in a much larger transconductance and thus a higher frequency of operation than are obtainable with the silicon device.

Similar devices which employ an acceptor layer of P-type AlGaAs and thus utilize a two-dimensional hole gas (2DHG) have recently been developed. This device operates in a manner similar to a silicon P-type MOS transistor. The use of complementary pairs of silicon MOS transistors (CMOS) to provide low power dissipation circuitry is well known. Similarly, it would be desirable to fabricate integrated circuit structures incorporating complementary pairs of modulation-doped field effect transistors. The fabrication of such devices, however, employing conventional processing procedures used in the fabrication of the two types of devices individually would be complex and expensive.

SUMMARY OF THE INVENTION

An improved method of fabricating a complementary pair of modulation-doped field effect transistors comprises depositing a first layer of undoped semiconductor material on a substrate. The semiconductor material is of single crystal structure and the layer has a surface. N-type conductivity imparting material is introduced into a first region of the first layer at the surface, and P-type conductivity imparting material is introduced into a second region of the first layer at the surface. An epitaxial second layer of undoped semiconductor material is deposited on the surface of the first layer to form a spacer layer. The spacer layer has an interface with the first layer and has a surface spaced from the interface. Next, an epitaxial third layer of undoped semiconductor material is deposited on the surface of the spacer layer to form an undoped third layer of semiconductor material having an interface with the spacer layer and a surface spaced therefrom. The semiconductor material of the third layer has a band gap less than the band gap of the semiconductor material of the first layer. First and second gate members are placed on the surface of the third layer overlying portions of the first and second regions, respectively. The first and second gate members form rectifying barriers with the undoped semiconductor material of the third layer. N-type conductivity imparting material is introduced into spaced apart first and second zones of the third layer extending from the surface of the third layer to the spacer layer and overlying portions of the N-type first region. Similarly, P-type conductivity imparting material is introduced into spaced apart third and fourth zones of the third layer extending from the surface of the third layer to the spacer layer and overlying portions of the P-type second region. Ohmic contacts are then applied to the first and second N-type zones and to the third and fourth P-type zones.

Monolithic integrated circuit structure in accordance with the present invention incorporating a complementary pair of modulation-doped field effect transistors comprises a substrate and a first layer of undoped single crystal semiconductor material contiguous with the substrate. A second spacer layer of undoped semiconductor material is contiguous with the first layer at an interface therewith. A first region of N-type conductivity is inset in the first layer of undoped semiconductor material at the interface, and a second region of P-type conductivity is inset in the first layer of undoped semiconductor material at the interface. A third layer of undoped semiconductor material is contiguous with the second spacer layer at an interface therewith and has a surface spaced from the interface. The semiconductor material of the third layer has a band gap less than the band gap of the semiconductor material of the first layer. A first gate member on the surface of the third layer overlies a portion of the first region and forms a rectifying barrier with the undoped semiconductor material of the third layer. A second gate member on the surface of the third layer overlies a portion of the second region and forms a rectifying barrier with the undoped semiconductor material of the third layer. First and second spaced apart zones of N-type conductivity are inset in the third layer and extend from the surface thereof to the spacer layer. The zones overlie portions of the first region with the first gate member interposed between them at the surface. Third and fourth spaced apart zones of P-type conductivity are inset in the third layer and extend from the surface thereof to the spacer layer. The zones overlie portions of the second region with the second gate member interposed between them at the surface. The first region of N-type conductivity forms the donor region, the first and second N-type zones form the source and drain regions, the region of undoped semiconductor material of the third layer between the source and drain regions forms the two-dimensional electron gas region, and the first gate member forms the control gate of a first modulation-doped field effect transistor. The second region of P-type conductivity forms the acceptor region, the third and fourth P-type zones form the source and drain regions, the region of undoped semiconductor material of the third layer between the source and drain regions forms the two-dimensional hole gas region, and the second gate member forms the control gate of a second modulation-doped field effect transistor complementary to the first modulation-doped field effect transistor.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

In fabricating a monolithic integrated circuit structure containing complementary modulation-doped field effect transistors (MODFET's) in accordance with the invention as illustrated in the figures a substrate of single crystal semi-insulating semiconductor material is provided as a supporting structure. As is well understood, the substrate is usually a slice or wafer of relatively large surface area upon which many identical circuit networks each including many devices are fabricated simultaneously. However, for purposes of illustration, the fabrication of only one pair of complementary GaAs/AlGaAs MODFET's in a fragment of a slice will be shown and described.

Figure 1:
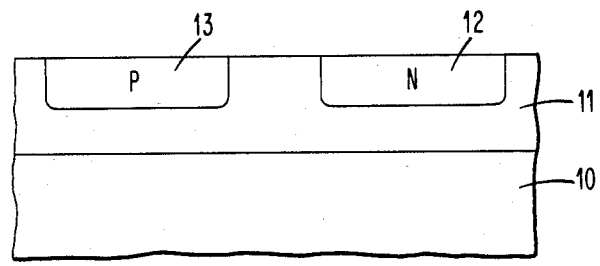
FIGS. 1-4 are a series of elevational views in cross-section illustrating various stages in the fabrication of a complementary pair of modulation-doped GaAs field effect transistors in accordance with the present invention.

A slice or wafer of single crystal GaAs of uniform, high resistivity having flat, planar, parallel, opposed major surfaces, a fragment 10 of which is illustrated in FIG. 1 is produced by any of the known techniques of GaAs crystal fabrication including appropriate slicing and cleaning operations. An epitaxial layer 11 of undoped AlGaAs is grown on the surface of the substrate as by known molecular beam epitaxy or chemical vapor deposition techniques. A layer 11 which is precisely controlled as to thickness and which is a continuation of the crystalline structure of the single crystal GaAs substrate 10 is thus deposited on the layer of semi-insulating GaAs at the surface of the substrate. The upper surface of the AlGaAs layer 11 is parallel to the interface between the substrate and the epitaxial layer 11.

Next, as illustrated in FIG. 1, a heavily doped N-type region 12 of low resistivity and a heavily doped P-type region 13 of low resistivity are formed in the undoped AlGaAs layer 11. N and P-type conductivity imparting materials are introduced into the appropriate regions by employing known ion implantation techniques with the surface of the layer 11 appropriately masked during each ion implantation procedure. The slice is then annealed in order to remove lattice damage caused by the ion implantation process and to electrically activate the implanted ions. The annealing procedure may be a heat treatment carried out in an arsenic-rich atmosphere in the reactor which is to be employed in depositing subsequent epitaxial layers. Typically, such an annealing procedure may be carried out at a temperature of 850° C. for about 15 minutes. Annealing may be eliminated at this point in favor of a single anneal after implantation of the sources and drains to be discussed hereinbelow.

Figure 2:
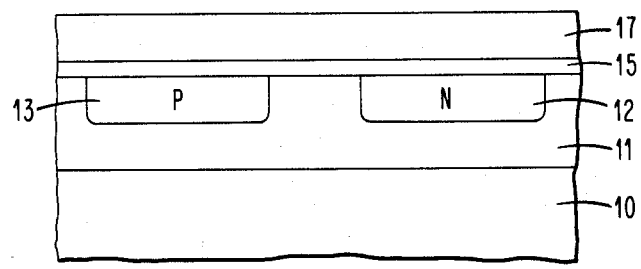

As illustrated in FIG. 2 an epitaxial layer of undoped AlGaAs 15 is deposited on the surface of the first undoped AlGaAs layer 11, which has the N- and P-type regions 12 and 13 inset therein. This layer of undoped AlGaAs 15 is a spacer layer and is of the order of 100 angstroms thick. An epitaxial layer of undoped GaAs 17 is then grown on the surface of the spacer layer 15. The band gap of the GaAs of the layer 17 is less than the band gap of the AlGaAs of the undoped AlGaAs layer 11. The undoped GaAs layer 17 is about 1000 angstroms thick.

Figure 3:
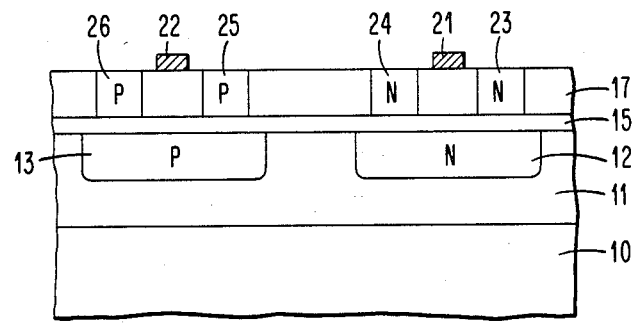
Figure 5:
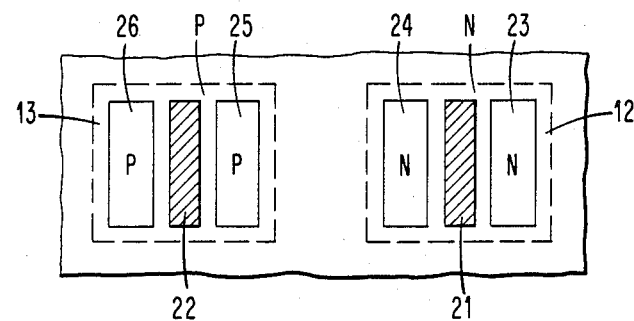
FIG. 5 is a plan view illustrating the pattern of elements of a complementary pair of modulation-doped GaAs field effect transistors in accordance with the present invention.

Next, gate members 21 and 22 are deposited on the surface of the undoped GaAs layer 17 overlying the central portions of the N-type and P-type regions 12 and 13, respectively, as illustrated in FIG. 3. The gate members 21 and 22, are of an appropriate material to form rectifying Schottky barriers with the undoped GaAs layer 17. N-type conductivity imparting material is then introduced into zones 23 and 24 extending from the surface of the undoped GaAs layer 17 to the interface with the undoped AlGaAs spacer layer 15. The two zones 23 and 24 overlie the N-type region 12 and are spaced apart with the gate member 21 interposed between them at the surface. Similarly, P-type zones 25 and 26 are formed in the undoped GaAs layer 17 as by ion implantation. The zones 25 and 26 extend from the surface of the layer to the interface with the spacer layer 15. The zones 25 and 26 overlie the P-type region 13 and are spaced apart with the gate member 22 interposed between them at the surface. FIG. 5 is a plan view further illustrating the arrangement of the various elements with respect to each other.

Annealing is then carried out in order to electrically activate the implanted ions in the N-type zones 23 and 24 and the P-type zones 25 and 26. The slice is then processed in accordance with known techniques to provide metallized ohmic contacts 31, 32, 33, and 34 to the N-type zones 23 and 24 and the P-type zones 25 and 26, respectively, as illustrated schematically in FIG. 4.

The combination of structural elements 41 constitutes a two-dimensional electron gas (2DEG) GaAs modulation-doped field effect transistor (N-type MODFET). The N-type zones 23 and 24 provide the drain and source, respectively. Electrons from the N-type donor region 12 form a two-dimensional electron gas in the region 43 between the source 24 and drain 23. The Schottky barrier gate 21 controls the flow of current carriers through the two-dimensional electron gas 43 between the source 24 and drain 23. Device 42 is a two-dimensional hole gas (2DEG) GaAs modulation-doped field effect transistor (P-type MODFET). The P-type zones 25 and 26 are the source and drain, respectively. Holes from the P-type acceptor region 13 form a two-dimension hole gas in the region 44 between the source 25 and drain 26. The Schottky barrier gate 22 controls the flow of current carriers through the two-dimensional hole gas 44 between the source 25 and drain 26. The two MODFET's 41 and 42 may be connected in a complementary arrangement which operates with low power dissipation by appropriate electrical connections (not shown). The drain connection 34 of the P-type MODFET 42 is connected to ground, and the drain connection 31 of the N-type MODFET 41 is connected to a positive voltage source. The gates 21 and 22 are connected in common to provide an input connection, and the source connections 32 and 33 are connected in common to provide an output connection.

Figure 4:
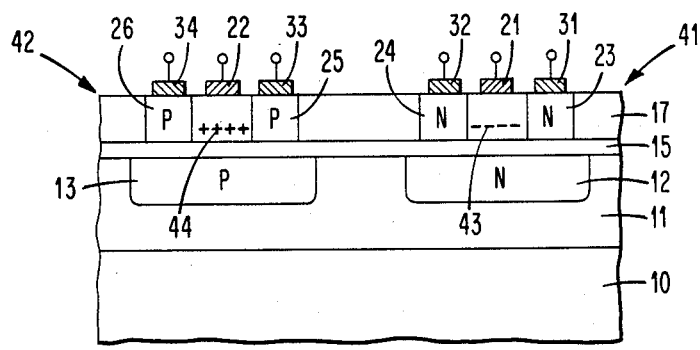
Figure 6:
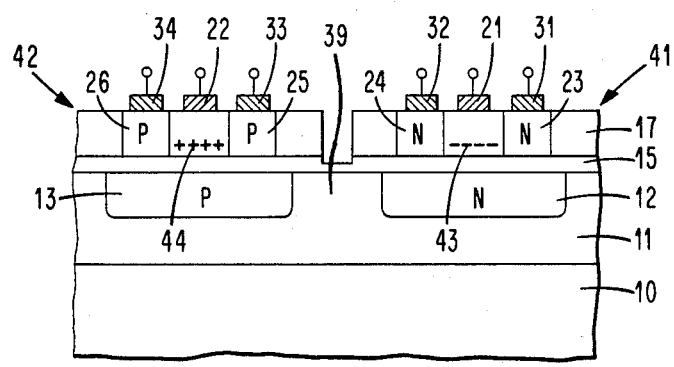
FIG. 6 is an elevational view in cross-section illustrating a modified GaAs modulation-doped field effect transistor in accordance with the present invention.

FIG. 6 illustrates a modification of the structure illustrated in FIG. 4 in which material of the GaAs layer 17 and of a portion of the AlGaAs spacer layer 15 located between the two devices 41 and 42 is removed to provide a gap 39 between the two devices 41 and 42. The gap 39 extends from the surface of the GaAs layer 17 to a depth beyond the interface of the GaAs layer 17 with the spacer layer 15. The gap 39 ensures that there will be no lateral movement of the two-dimensional electron gas or the two-dimensional hole gas along the interface between the GaAs layer 17 and the spacer layer 15.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating a complementary pair of modulation-doped field effect transistors comprising
   depositing a first layer of undoped semiconductor material on a substrate, said first layer of undoped semiconductor material being of single crystal structure and having a surface,
   introducing N-type conductivity imparting material into a first region of said first layer at said surface, and introducing P-type conductivity imparting material into a second region of said first layer at said surface;
   depositing an epitaxial second layer of undoped semiconductor material on said surface of said first layer to form a spacer layer having an interface with said first layer at said surface thereof and having a surface spaced therefrom;
   depositing an epitaxial third layer of undoped semiconductor material on the surface of said spacer layer to form an undoped third layer of semiconductor material having an interface with said spacer layer of semiconductor material at said surface thereof and having a surface spaced therefrom, the semiconductor material of the third layer having a band gap less than the band gap of the semiconductor material of said first layer;
   placing first and second gate members on said surface of said third layer overlying portions of said first and second regions, respectively, said first and second gate members forming rectifying barriers with the undoped semiconductor material of said third layer;
   introducing N-type conductivity imparting material into spaced apart first and second zones of said third layer extending from the surface of the third layer to said spacer layer and overlying portions of said first region, and introducing P-type conductivity imparting material into spaced apart third and fourth zones of said third layer extending from the surface of the third layer to said spacer layer and overlying portions of said second region; and
   applying ohmic contacts to the first and second N-type zones and to the third and fourth P-type zones.

2. The method in accordance with claim 1 wherein introducing N-type conductivity imparting material into a first region of said first layer and introducing P-type conductivity imparting material into a second region of said first layer includes ion-implanting N-type conductivity imparting material into said first region and ion-implanting P-type conductivity imparting material into said second region.

3. The method in accordance with claim 1 wherein introducing N-type conductivity imparting material into a first region of said first layer and introducing P-type conductivity imparting material into a second region of said first layer includes ion-implanting N-type conductivity imparting material into said first region and ion-implanting P-type conductivity imparting material into said second region.

4. The method in accordance with claim 3 including subsequent to ion-implanting N-type and P-type conductivity imparting materials
   annealing to remove lattice damage and to electrically activate the implanted ions.

5. The method of fabricating a complementary pair of modulation-doped GaAs/AlGaAs field effect transistors comprising
   depositing a first layer of undoped AlGaAs on a substrate, said first layer of undoped AlGaAs being of single crystal structure and having a surface,
   introducing N-type conductivity imparting material into a first region of said first layer at the said surface, and introducing P-type conductivity imparting material into a second region of said first layer at said surface;
   depositing an epitaxial second layer of undoped AlGaAs on said surface of said first layer of undoped AlGaAs to form a spacer layer having an interface with said first layer at said surface thereof and having a surface spaced therefrom;
   depositing an epitaxial third layer of undoped GaAs on the surface of said spacer layer to form an undoped GaAs third layer having an interface with said spacer layer at said surface thereof and having a surface spaced therefrom;
   placing first and second gate members on said surface of said undoped GaAs third layer overlying portions of said first and second regions, respectively, said first and second gate members forming rectifying barriers with the undoped GaAs of said third layer;
   introducing N-type conductivity imparting material into spaced apart first and second zones of said third layer extending from the surface of the third layer to said spacer layer and overlying portions of said first region, and introducing P-type conductivity imparting material into spaced apart third and fourth zones of said third layer extending from the surface of the third layer to said spacer layer and overlying portions of said second region; and
   applying ohmic contacts to the first and second N-type zones and to the third and fourth P-type zones.

6. The method in accordance with claim 5 including removing a portion of said undoped GaAs third layer and a portion of said spacer layer between said first and second regions.

* * * * *